United States Patent
Agarwal et al.

(10) Patent No.: US 11,333,707 B2
(45) Date of Patent: May 17, 2022

(54) TESTING OF INTEGRATED CIRCUITS DURING AT-SPEED MODE OF OPERATION

(71) Applicant: Texas Instruments Incorporated, Dallas, TX (US)

(72) Inventors: Khushboo Agarwal, Bangalore (IN); Sanjay Krishna Hulical Vijayaraghavachar, Karnataka (IN); Raashid Moin Shaikh, Bangalore (IN); Srivaths Ravi, Bangalore (IN); Wilson Pradeep, Bangalore (IN); Rajesh Kumar Tiwari, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/703,909

(22) Filed: Dec. 5, 2019

(65) Prior Publication Data

US 2020/0132763 A1 Apr. 30, 2020

Related U.S. Application Data

(63) Continuation of application No. 14/605,354, filed on Jan. 26, 2015, now abandoned.

(30) Foreign Application Priority Data

Jan. 24, 2014 (IN) .............................. 312/CHE/2014

(51) Int. Cl.
*G06F 30/33* (2020.01)
*G01R 31/317* (2006.01)

(52) U.S. Cl.
CPC . *G01R 31/31721* (2013.01); *G01R 31/31707* (2013.01); *G01R 31/31727* (2013.01)

(58) Field of Classification Search
CPC .. G06F 21/79; G06F 21/86; G06F 2221/2129; G06F 1/1626; G06F 12/0866; G06F 2212/2022; G06F 15/00; G06F 7/57; G06F 9/226; G06F 9/265; G06F 9/30094; G06F 9/30101; G06F 9/3885; G06T 1/20;
(Continued)

(56) References Cited

U.S. PATENT DOCUMENTS 6,408,413 B1    6/2002  Whetsel
7,240,314 B1 *  7/2007  Leung ..................... G06F 30/39
                                                257/773
(Continued)

*Primary Examiner* — Binh C Tat
(74) *Attorney, Agent, or Firm* — Valerie M. Davis; Charles A. Brill; Frank D. Cimino

(57) ABSTRACT

Methods for testing an application specific integrated circuit (ASIC). A set of representations is created that overlays power density information and clock gate physical locations of a set of clock gates in a critical sub-chip of the ASIC for test mode power analysis. The set of representations are further grouped in the sub-chip into various groups based on overlapping of the set of representations. Then, a set of test control signals is generated corresponding to each of the set of clock gates during at-speed test mode of operation such that each clock gate with overlapping representations receive different test control signals. Further, patterns are generated using a virtual constraint function to selectively enable the set of test control signals such that the set of test control signals are not activated simultaneously.

18 Claims, 10 Drawing Sheets

(58) Field of Classification Search
CPC ........ G01R 31/31727; G01R 31/31721; H01L 2924/13091
USPC ................................. 716/100–106, 136–139
See application file for complete search history.

(56) References Cited

U.S. PATENT DOCUMENTS

| | | | |
|---|---|---|---|
| 8,677,306 B1* | 3/2014 | Andreev | G06F 11/267 716/136 |
| 2006/0277509 A1 | 12/2006 | Tung et al. | |
| 2008/0059855 A1 | 3/2008 | Whetsel | |
| 2009/0187799 A1 | 7/2009 | Jaber et al. | |
| 2010/0299571 A1 | 11/2010 | Whetsel | |
| 2011/0084774 A1* | 4/2011 | Papaefthymiou | H03K 5/00 331/117 FE |
| 2012/0017185 A1 | 1/2012 | Padmanabhan et al. | |
| 2012/0053924 A1* | 3/2012 | Wang | G01R 31/318544 703/15 |
| 2012/0126781 A1* | 5/2012 | Narayanan | G01R 31/3004 324/76.11 |
| 2013/0104097 A1 | 4/2013 | Durbha et al. | |
| 2015/0276824 A1* | 10/2015 | Narayanan | G01R 31/3181 324/750.3 |

* cited by examiner

```
reg [63:0] spram[255:0];
reg [7:0] addr_reg;

always @ (posedge clk)
began
        //Write
        if (we)
                spram[addr] <=
        data;
        addr_reg <+ addr;
end
assign q = spram[addr_reg]
```

TESTING OF INTEGRATED CIRCUITS DURING AT-SPEED MODE OF OPERATION

CROSS REFERENCE TO RELATED APPLICATIONS

This continuation application claims priority to U.S. patent application Ser. No. 14/605,354, filed Jan. 26, 2015 which claims priority to India provisional patent application No. 312/CHE/2014, filed Jan. 24, 2014, which is hereby incorporated herein by reference in its entirety.

TECHNICAL FIELD

The present disclosure relates to testing of integrated circuits during at-speed mode of operation.

BACKGROUND

Power consumption during the test mode of circuit operation is a major concern for scan based low power circuits. While there are multiple design for testability (DFT) and automatic test pattern generation (ATPG) techniques in the art for addressing both shift and capture power reduction, most of the solutions are coarse-grained in nature that they attempt to reduce power while being agnostic of the local power density in the power grid and its impact on the local dynamic IR Drop. Hence, such solutions can only fortuitously alleviate any local IR drop issues in the power grid, especially those arising from differences between functional and test mode use case scenarios.

SUMMARY

One aspect provides a method for testing an application specific integrated circuit (ASIC). A set of representations (referred to as power equivalent polygons, PEPs) is created that overlays power density information and clock gate physical locations of a set of clock gates in a critical sub-chip of the ASIC for test mode power analysis. The set of representations are further grouped in the sub-chip into various groups based on overlapping of the set of representations. Then, a set of test control signals is generated corresponding to each of the set of clock gates during at-speed test mode of operation such that each clock gate with overlapping representations (PEPs) receive different test control signals from the set of test control signals. Further, patterns are generated using a virtual constraint function to selectively enable the set of test control signals such that the set of test control signals are not activated simultaneously.

Another aspect provides a system for testing an IC. The system includes a computer system having a test processor, the test processor being coupled to the integrated circuit, the integrated circuit having a set of sub-chips, a plurality of cores and a cache, an I/O port. The test controller is configured to activate a set of clock gates in the set of sub-chips in a neighborhood of the integrated circuit in selective manner during at-speed mode of operation.

Other aspects and example embodiments are provided in the Drawings and the Detailed Description that follows.

BRIEF DESCRIPTION OF THE VIEWS OF DRAWINGS

FIG. 1a depicts an RTL code snippet of a common structure, FIFO, found in most circuits;

FIG. 1b depicts a circuit schematic of FIG. 1a;

DETAILED DESCRIPTION OF THE EMBODIMENTS

Figures 1A, 1B:
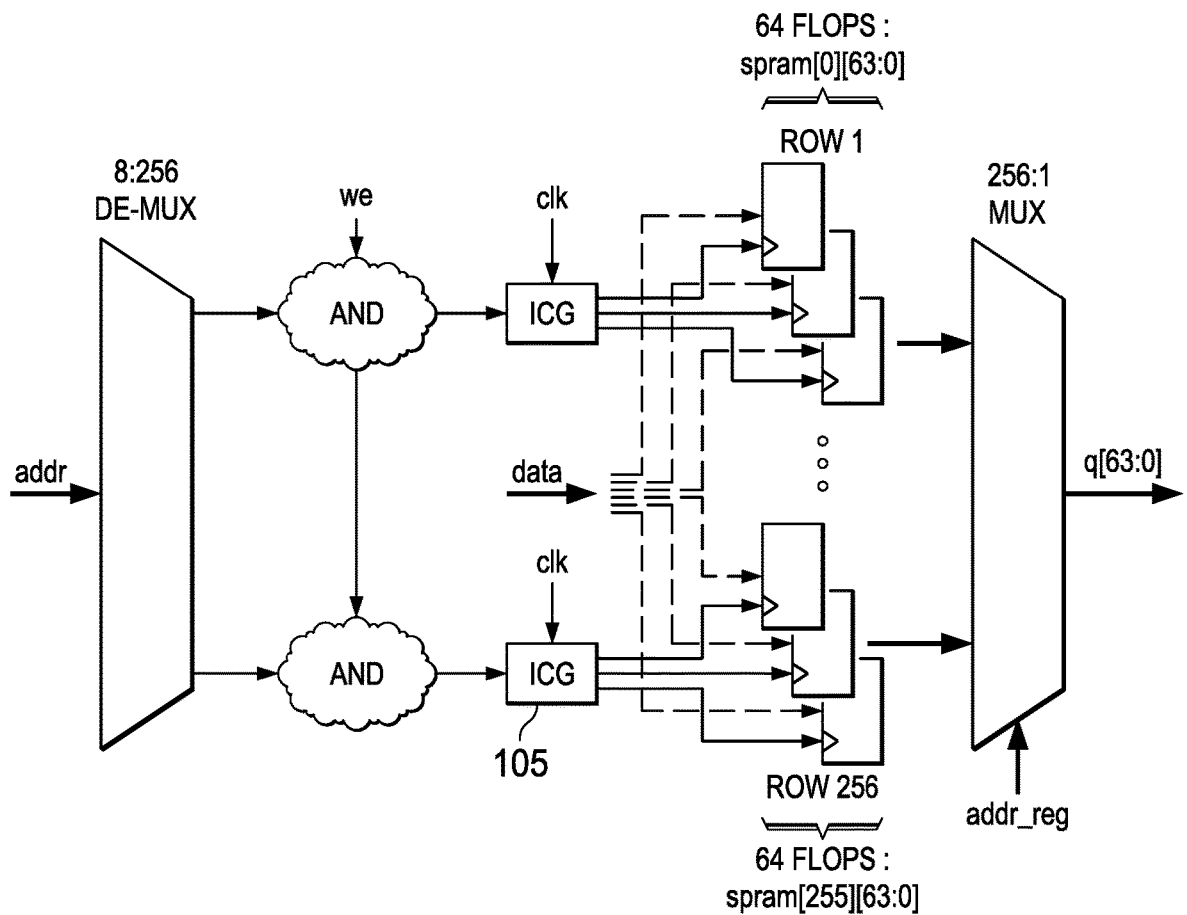

Power consumption is today a critical and often cost defining dimension for a wide array of electronic and computing systems ranging from small-scale embedded sensors and battery operated mobile appliances to large-scale compute clusters and data centers. Not surprisingly, these systems and transitively the integrated circuits (ICs) used in them need to be designed and tested in the face of ever shrinking power budgets.

While power consumption in application use modes of chip operation has always received attention since it defines the product specification, power consumption in the test mode of operation had often been overlooked until various issues such as burnt sockets due to thermal runaway during burn-in tests and spurious yield issues due to elevated test mode IR drop during at-speed transition fault tests (TFT) thrust test power to the forefront. A wide range of hardware (DFT) and software (ATPG) techniques have since been proposed to reduce the power consumed during both shift and capture operations of scan based tests. However, each technique is associated with its own tradeoffs in power reduction effectiveness, test quality and test time, applicability to compression, applicability to various test types (eg. launch-off-capture (LOC) vs launch-off-shift (LOS)), usability with commercial ATPG flows, etc. Invariably, a combination of techniques is deployed in chips today to address target test power reduction goals subject to design constraints.

Several techniques have been proposed in the art for reducing shift mode power consumption. The techniques range from a "simple" reduction of shift frequency to providing DFT support that (a) reduce redundant toggling (e.g., partial or complete scan cell gating) and/or (b) reduce concurrent chip switching (e.g., scan segmentation or partitioning and staggered clocking). Additionally, ATPG techniques can add switching constraints to conventional ATPG or fill don't care bits in patterns in a power-aware manner to generate low power pattern sets.

Relatively, there are lesser number of techniques that have focused on reducing capture power reduction during at-speed testing. On ATPG front, some of the fill techniques mentioned above have also attempted to reduce capture power. In practice though, fill techniques have only been moderately effective in industrial designs and in the presence of test compression technologies. With the recognition that clock gating is used de-facto in designs for dynamic power reduction and ATPG patterns tend to turn on more clock gates than functional use cases, ATPG tools today can generate patterns subject to a user specified clock gate switching threshold. This technology is associated with trade-offs in pattern count and runtimes, and hence is used by DFT and test engineering teams for the silicon debug of any V min or F max issues (if caused by higher IR drop due to elevated at-speed switching) or for production tests in highly power constrained designs. A generic limitation of most existing at-speed clock gating enable/disable solutions is that they attempt to reduce capture power as a whole while being agnostic of the design's local power grid constraints. More recently, some techniques propose the addition of DFT test points to the functional enable of the clock gating logic to provide more granular control and to ease the burden of the ATPG tool to generate low power patterns. While neither works directly address local IR drop issues, they can be built upon to tackle the problem. However, adding logic to the functional enable has two-fold challenges: (i) re-used IPs in a system on chip (SoC) will need to be updated and re-verified since the changes are intrusive and affect functionality and (ii) it adds to timing criticality of the half-cycle path to the clock gate latch. Therefore, it is necessary to have solutions that can alleviate local power density and dynamic IR drop hotspots in a non-intrusive manner.

Now, empirical data from two industrial chips is used to show the problems faced from test power perspective during at-speed mode of operation (also referred to as at-speed TFT capture). The first example in FIG. 1a, FIG. 1b and FIG. 2 exemplifies how circuit structures lend themselves to high test versus functional dynamic power differential, in turn leading to local IR drop hotpots. The second example in FIG. 3a and FIG. 3b uses one of the popular industrial DFT techniques, scan partitioning, to show how coarse-grained power reduction techniques can do little towards addressing local IR drop problems.

FIG. 1a depicts the RTL code snippet of a common structure, FIFO, found in most circuits. The 64 bit, 256 deep FIFO used in the illustration is synthesized into a 16348 flip-flop netlist. The flip-flops need to get a clock edge only when there is a valid write. Hence, there would be one clock gate per row of storage leading to 256 clock gates overall. The circuit schematic is outlined in FIG. 1(b), where clock gates are labelled as ICGs. The functional and test mode operations of the circuit are now analyzed. Functionally, address decoding will lead to only 64 flip-flops receiving clock at any clock cycle with a valid write. On the other hand, conventional test mode control of clock gates allows ATPG to bypass the functional clock gating enable altogether and has a potential of switching all 256 ICGs together.

Figure 2:
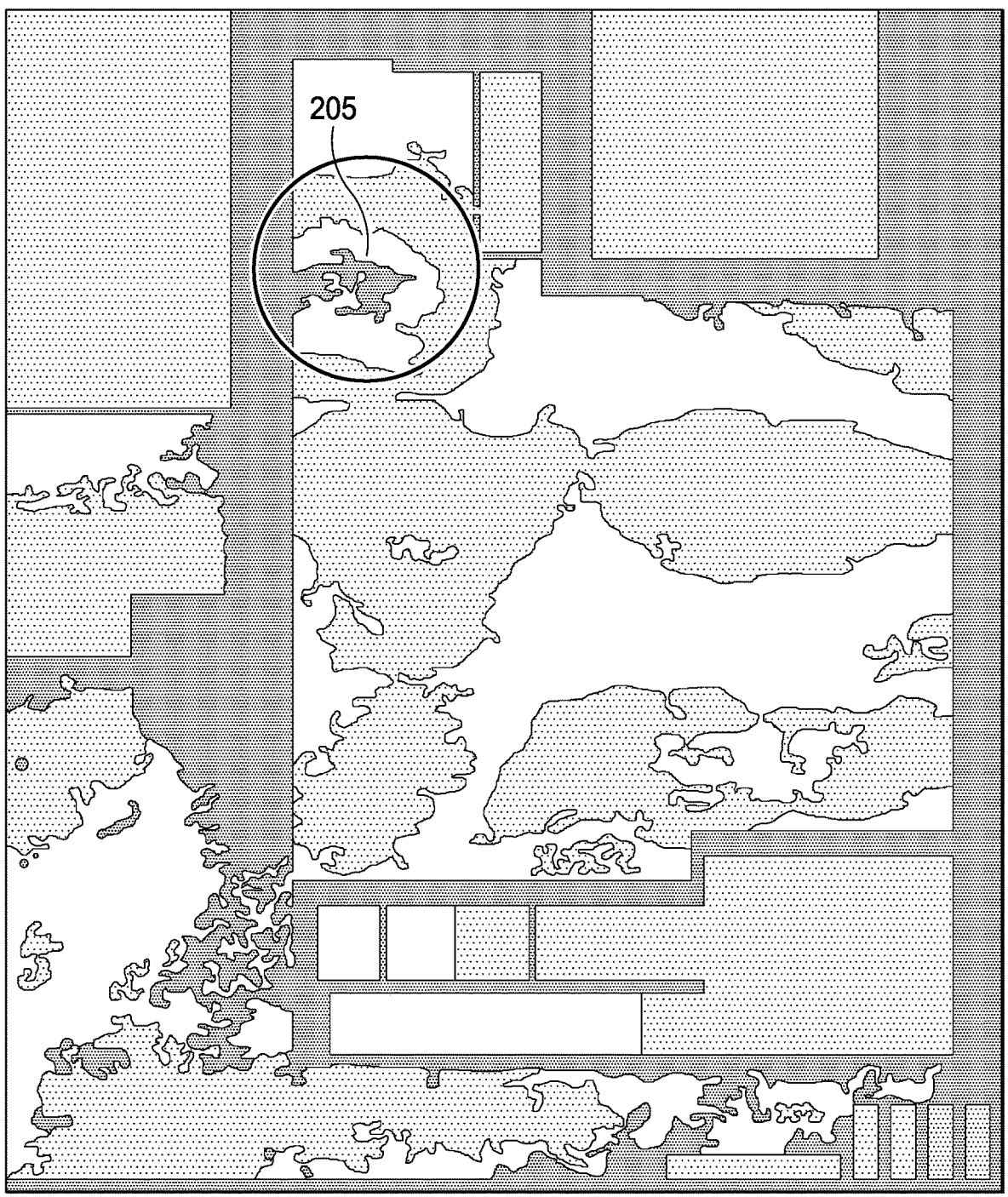
FIG. 2 depicts the impact of having such structures of FIG. 1a in a chip.

The impact of having such structures of FIG. 1b in a chip is depicted in FIG. 2. FIG. 2 depicts the dynamic IR drop profile corresponding to an at-speed LOC transition fault test (TFT) pattern of a crypto processing subsystem in a 45 nm chip. The IR drop profile bins regions based on the percentage IR drop relative to supply voltage against design specific thresholds and are colored accordingly. The area 205 indicates hotspots that need to be further analyzed for use-case based waivers or design/power grid fixes. The high IR drop section of the block called out in FIG. 2 corresponds to a register based FIFO structure, with the TFT patterns enabling up to all clock gates at a time. Thus, a very low functional dynamic power circuit has become an IR drop hotspot due to excessive local (spatial and temporal) activity in the test mode. Since the power grid in this section cannot support 100% clock toggles, the implications are clear—a mechanism is needed to lower the clock activity due to the clock gates in the area 205.

Figure 3B:
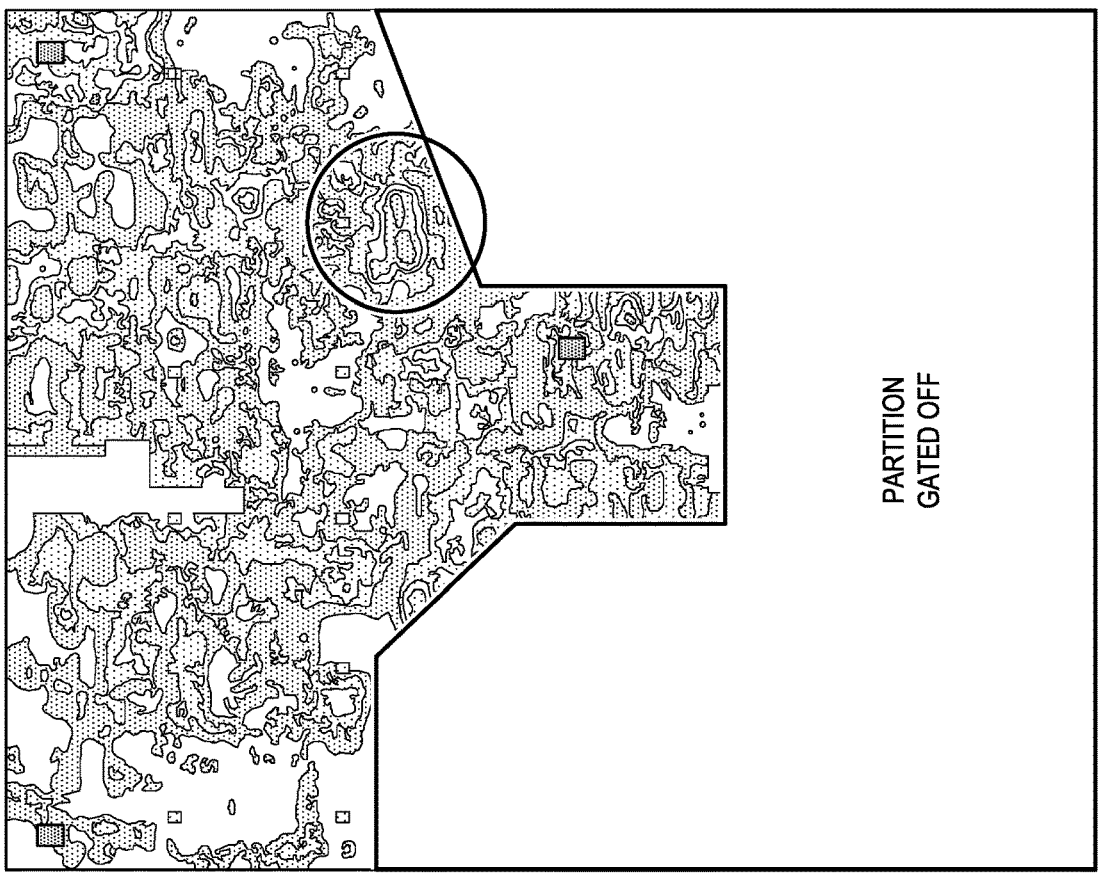
FIG. 3b depicts a corresponding dynamic IR drop profile with one partition gated off in the chip.
Figure 3A:
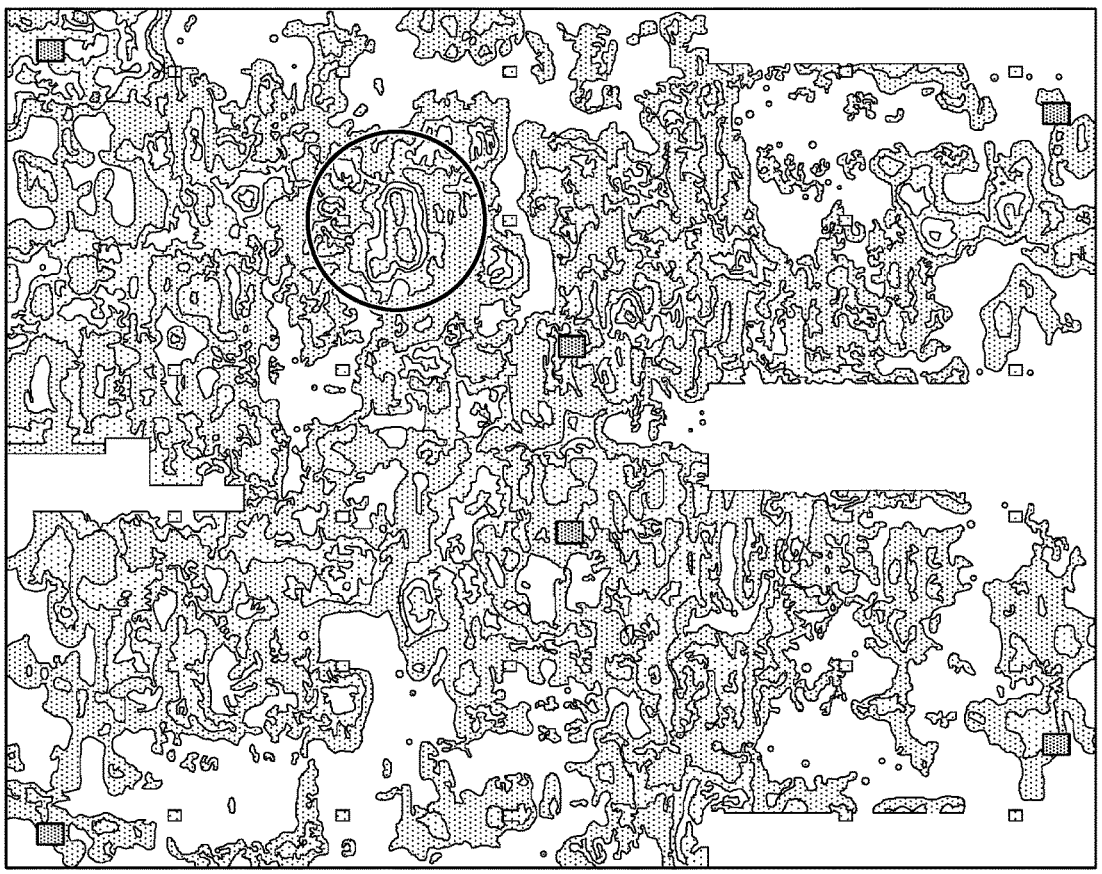
FIG. 3a depicts a baseline dynamic IR drop profile for a single voltage, single clock domain block in a chip.

FIG. 3(a) depicts the baseline dynamic IR drop profile for a single voltage, single clock domain block (290K flip-flops) in a 28 nm chip. The block also implements coarse-grained scan partitioning, i.e., the circuit is divided into two scan partitions as per layout and routing considerations to avoid simultaneous shift and capture across the complete block. FIG. 3(b) depicts the corresponding dynamic IR drop profile with one partition gated off. The power consumption characteristics of the block are tabulated in Table 1 below for both the baseline and coarse-grained scan partitioning scenarios during at-speed TFT. While peak and average power do come down with the use of partitioning, it is noted from the IR drop profiles as well as the table, that, the worst IR drop and hotspot locations remains more or less the same (the slight difference results from the difference in patterns generated in both scenarios). While coarse level partitioning can reduce average and peak power, dynamic IR drop alleviation needs local activity control.

TABLE 1

|  | Baseline | Coarse partitioning |
|---|---|---|
| Peak Power | 1510 mW | 641.6 mW |
| Average Power | 861 mW | 361 mW |
| Worst Drop | 14.14% | 14.42% |

Figure 4:
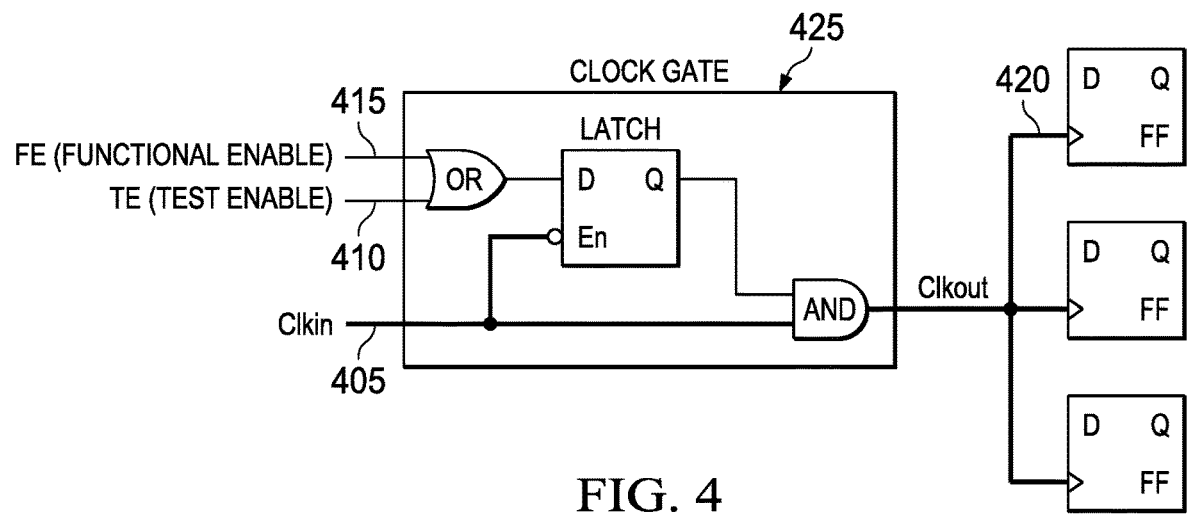
FIG. 4 depicts a structure of a clock gate that has integrated functional and test mode capabilities.

FIG. 4 depicts a structure of a clock gate that has integrated functional and test mode capabilities. The clock gate 425 takes an input clock 405 (Clkin), functional and test enable controls (FE (415) and TE (410)), and outputs the gated clock 420 (Clkout). The OR-ed value of the functional and test enables is latched when Clkin 405 changes from its low (latch transparent state) to high state, and is then used to qualify Clkin 405 to create Clkout 420. In simple terms, the clock is gated when both FE 415 and TE 410 are low and active when either of the enables is high. Most clock gates in a design (unless explicitly instantiated in RTL as is done for root clock gates) are typically inferred from the circuit behavior and inserted during synthesis. Further, cloning of clock gates is done to aid clock tree synthesis through clock gate fan-out guidelines. This practice also ensures that clock gates and the flip-flops/logic they service end up locally situated during placement. A natural observation that follows is that solving local IR drop issues for a given circuit can be reduced to developing solutions for independently managing clock gates and their activity.

Figure 5:
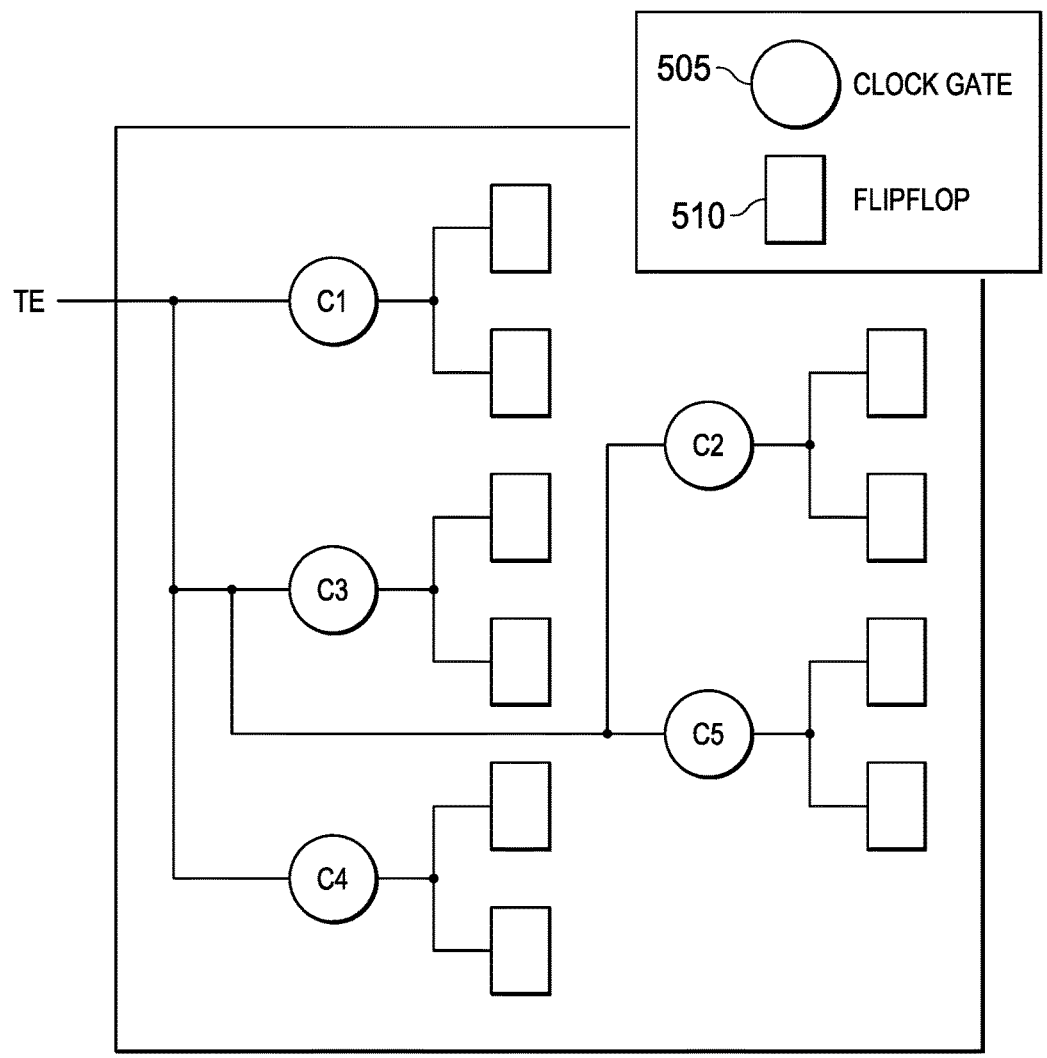
FIG. 5 depicts the hookup of test enable controls of clock gates in a circuit.
Figure 6B:
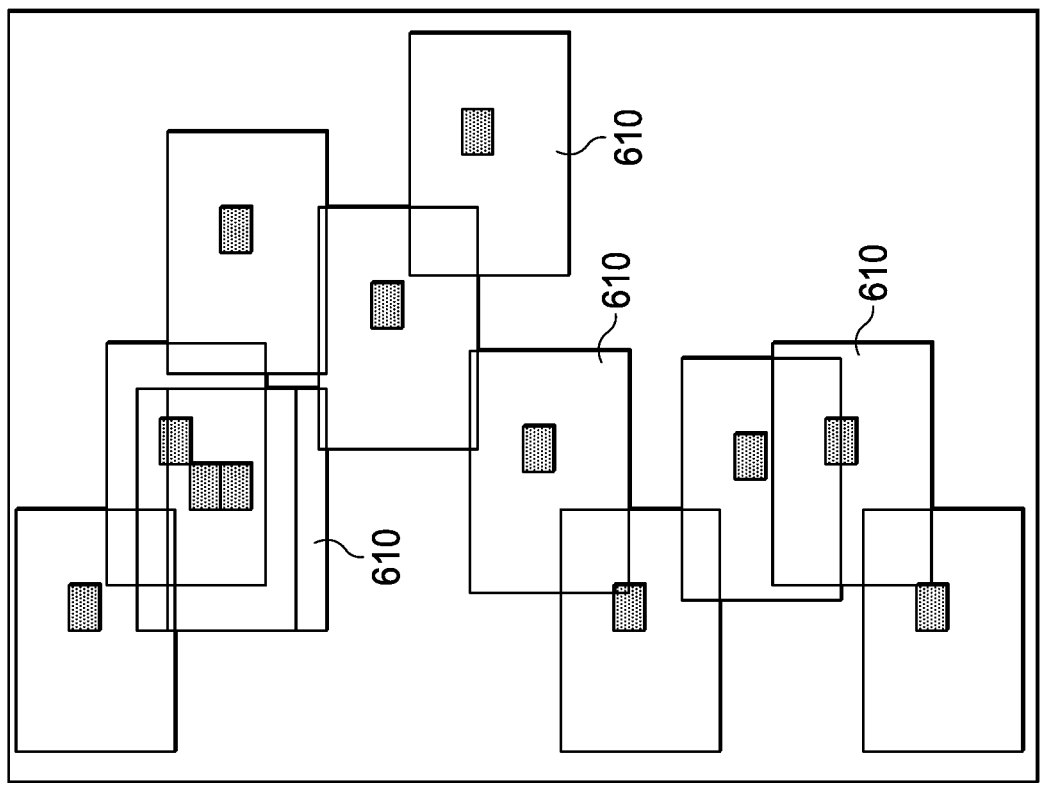
FIG. 6a and FIG. 6b depict a layout cross-section of an SoC.
Figure 6A:
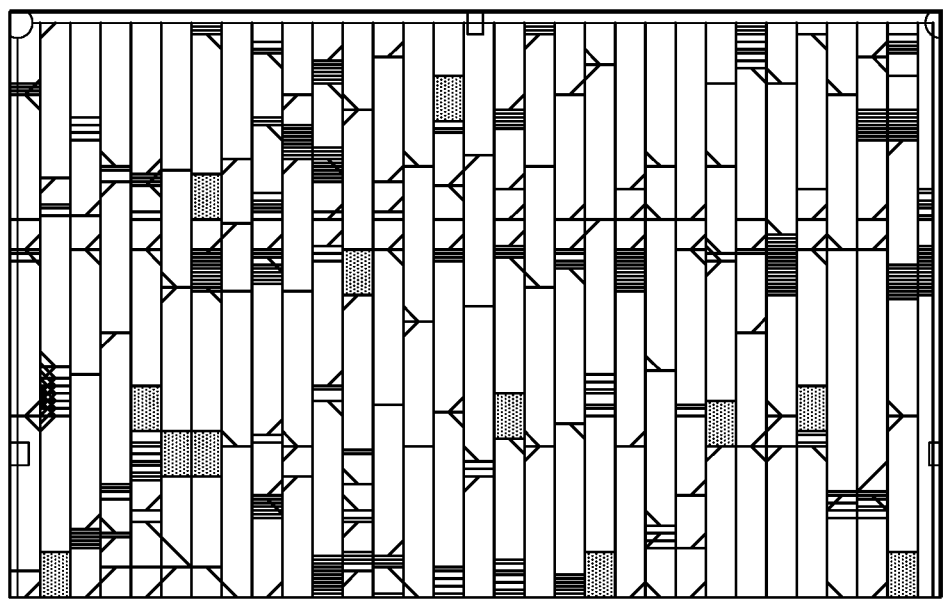

FIG. 5 depicts the hookup of test enable controls of clock gates in a circuit. During synthesis of the circuit, the test enable of all clock gates 505 (C1, C2, C3, C4 and C5) are hooked up to a single port (test enable, TE) at the circuit boundary level. This pin is further connected to the circuit's scan enable pin or more effectively to a scanned test register bit OR-ed with the scan enable pin. The hookup for TE as above allows ATPG to set all the clock gates in the design in one of two states, when TE=1 and when TE=0. When TE=1, all clock gates are ON during capture, which increases power dissipation and can create local hotspots. FIG. 6a and FIG. 6b depict the layout cross-section of an SoC, where the clock gates are all sharing the same TE (highlighted as black bodied squares). For each clock gate, there is a representation created (called power equivalent polygon or PEP hereinafter, 610) that is indicative of the power and locality that the power grid can service when the clock gate and its associated load switch. As can be noted from the FIG. 6b, when the clock gates are turned ON simultaneously with TE=1, there are many overlapping PEPs 610 leading to hotspots. When TE=0, ATPG now depends on the functional enable to switch clock gates ON or OFF. Since the functional enable is in turn dependent on the state of scan flip flops, it implies justifying values at the relevant flops to realize the desired FE values at the clock gates subject to resolution of any inter-dependencies. As a result, relying on just this state can potentially lead to both pattern inflation and coverage loss.

Figure 7:
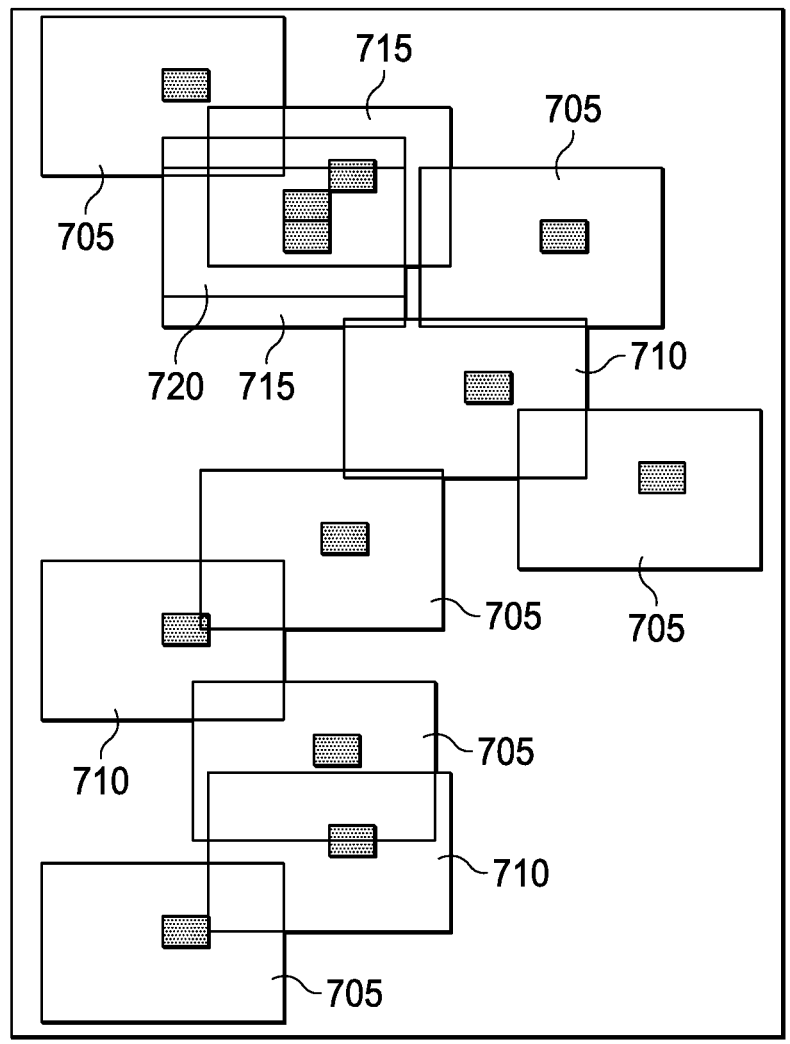
FIG. 7 depicts a layout of an ASIC having multiple test control signals to the clock gates according to an embodiment.

The approach according to an embodiment to alleviate the issue highlighted in FIGS. 6a and 6b is depicted in FIG. 7. Multiple test enable controls or test control signals (TE1 (705), TE2 (710), TE3 (715) and TE4 (720)) are provided to hook up to different clock gates in the circuit. Further, the hookup is done using the methodology outlined in FIG. 8 such that clock gates with overlapping PEPs have different test controls. By ensuring that clock gates with overlapping PEPs have different test controls, the chance of their simultaneous activation is lowered, meaning their activation is now dependent on the simultaneous activation of the respective functional enables. Thus, a locally aware multi-test enable hookup provides an opportunity to eliminate or minimize simultaneous switching in a local region and resulting IR drop hotspots.

Figure 8:
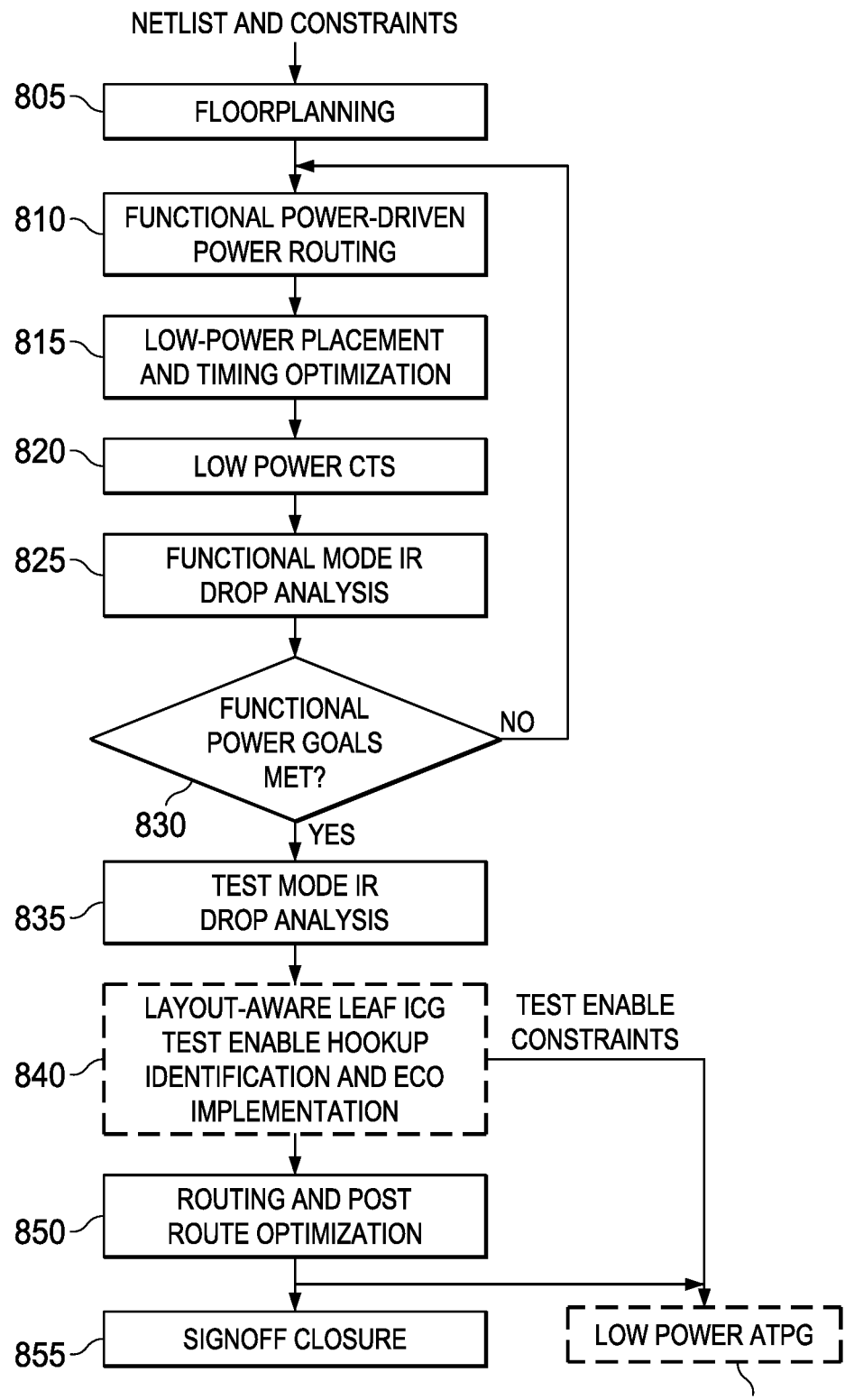
FIG. 8 depicts a method flow to test an ASIC during at speed mode of operation according to an embodiment.

FIG. 8 depicts a method flow according to an embodiment to test an ASIC during at speed mode of operation. The method flow provides a low power physical design flow that has been augmented with optimizations that enable layout-aware clock gate test controls. Steps 805, 810, 815 and 820 include floor planning, power routing, power-aware placement and timing optimizations, followed by power-aware clock tree synthesis (CTS). IR drop analysis is then done at step 825 to audit the design database at this stage from a functional power goal perspective at step 830. Steps 805-820 are then iterated as needed. After the design meets the functional power and IR drop budgets, test mode IR drop analysis is done at step 835. An embodiment is integrated in the flow at this stage at step 840 as a layout aware ICG test enable hookup identification engineering change order (ECO) implementation, and in turn consists of two key sub-steps.

The first sub-step is design analysis where the results of dynamic IR drop analysis is analyzed to identify critical sub-chips from a local instantaneous power hotspot perspective for at-speed TFT capture scenarios (at speed mode of operation). The second sub-step is a layout aware clock gate test control mapping algorithm. For the critical sub-chips identified, the algorithm provides multiple test enable controls for clock gates such that the local hotspots can be minimized. Both the sub-steps are explained in detail later in the specification.

The test enable control to clock gate mapping thus obtained is taken in as an ECO to the database. The updated database is taken into routing and post-route optimizations at step 850, and final signoff closure at step 855. The mapping is also conveyed to the ATPG engine to generate production test patterns. The ATPG engine treats the mapping as constraints that can be used to control test enable activation of clock gates during at-speed capture cycles at step 845. The ATPG customizations are described further in FIG. 11.

Figure 9:
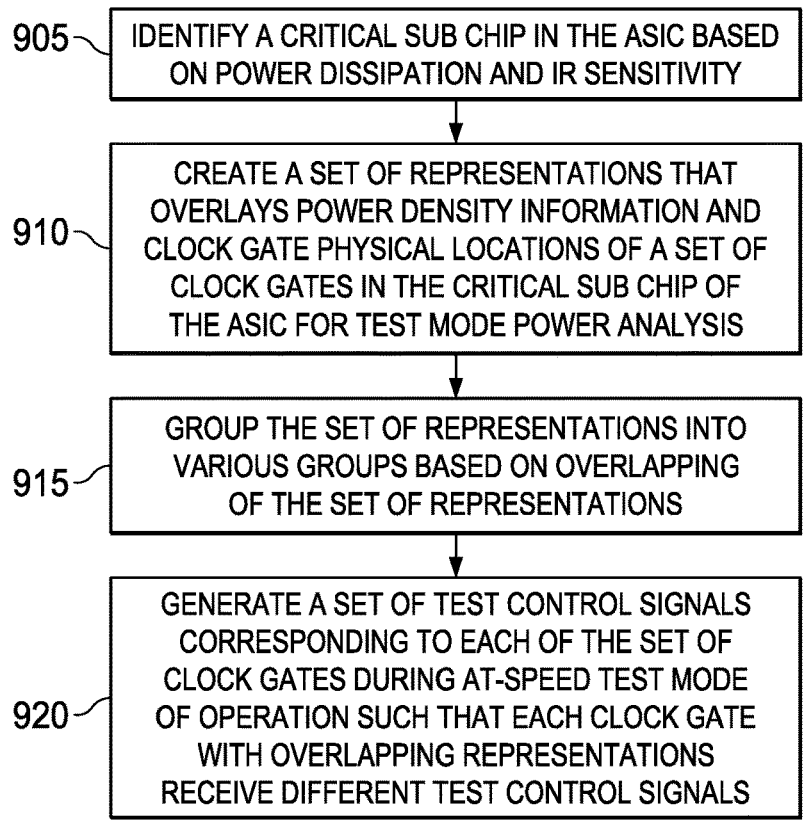
FIG. 9 depicts a method according to an embodiment for testing an ASIC.

Referring now to FIG. 9, a method according to an embodiment for testing an ASIC is depicted. At step 905, a critical sub-chip in the ASIC based on power dissipation and IR sensitivity is identified. For example, consider a floorplan of a 45 nm die. The die is designed for a wire-bond package with power sources at the periphery. Physical design closure of the chip proceeds through a divide and conquer approach with say 12 subsystems physically hardened independently (also called blocks). Static and dynamic IR drop analyses of the chip are performed to understand the robustness of the power distribution network in a chip for various use-case scenarios against design/package specific thresholds. Static IR drop analysis is first done to analyze the power grid from a global IR drop contour perspective. For regions identified as maximum average power hotspots, power grid augmentation is first done against existing floorplan and JO periphery constraints. This is followed up further by using existing DFT or ATPG techniques that reduce power consumption in a coarse-grained manner. Dynamic IR drop analysis is then done that calls out the locations that have instantaneously high IR drop. For at-speed capture use case scenario, the analysis is performed using waveforms corresponding to worst-case at-speed capture TFT patterns exercising targeted portions of the chip. Alternatively, this is done in a vectorless manner with the test enable control of all clock gates allowed to be ON simultaneously and associating representative toggle activity to the scan flops.

Figure 10:
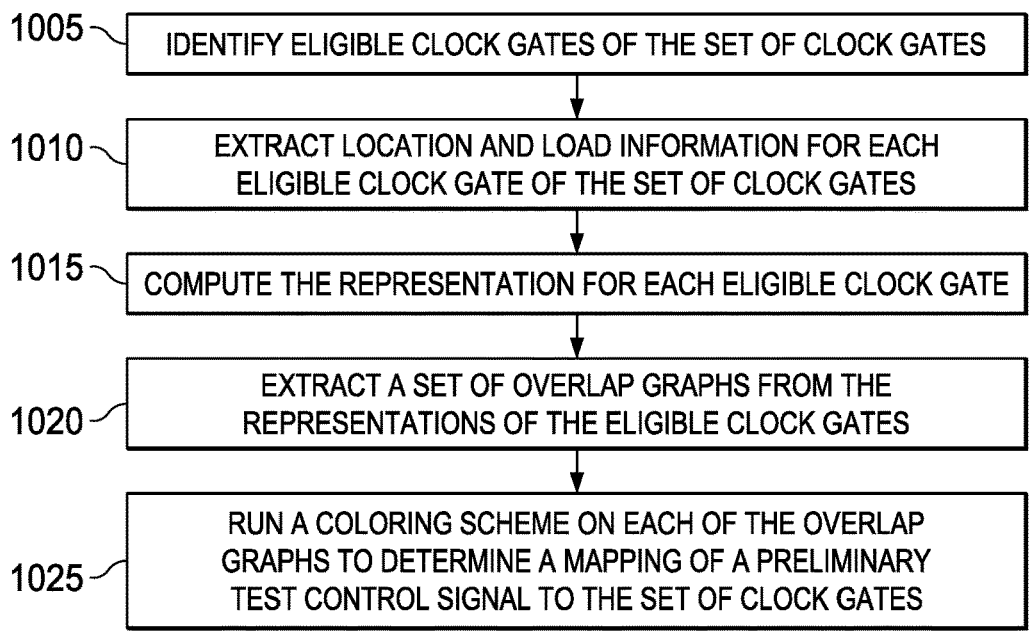
FIG. 10 depicts a method of creating the set of representations according to an embodiment.

At step 910, the set of representations (PEPs) are created that overlays power density information and clock gate physical locations of a set of clock gates in a critical sub-chip of the ASIC for test mode power analysis. FIG. 10 depicts the method of creating the set of representations (PEPs) according to the embodiment. Steps 1005-1015 are performed to extract clock gates and their physical and power grid characteristics. At step 1005, all eligible clock gates are identified for a given test clock group in a circuit. An ICG is considered eligible if it belongs to the relevant test clock group and if it is a leaf clock gate where the test enable is re-connected without compromising functionality.

For each eligible clock gate, the location and load information from the circuit's physical design database is extracted at step 1010. As mentioned earlier, the Power Equivalent Polygon or PEP (the representation) for each eligible clock gate is indicative of the power and locality that the power grid can service when the clock gate and its associated load switch. Therefore the PEP is abstracted as the locus around the clock gate to which the switching power of the clock gate and its load can be mapped.

Mathematically, the PEP is computed as follows at step 1015. If P denotes the power limit per unit area (power grid design constraint), A the area of the PEP, L the ICG Load, F the frequency of operation, and V the voltage of operation, $$P*A=0.5*L*V^2*F$$

Since the interconnect is typically Manhattan, the PEP is, for example, modelled as a rhomboid (since every point on the rhombus will be equidistant in a Manhattan sense) or in a simpler manner as a square. If E is the edge of the square, it follows that $$E=(0.5*V^2*F/P)^{1/2}*L^{1/2}$$

For example, if P=100 mW/mm2, F=200 MHz, V=1.1V, a load L of 50 fF gives an edge size of 7.8 u.

An example of PEPs extracted for one cross-section of a die is depicted in FIG. 6. At step 915, the set of PEPs in the sub-chip is grouped into various groups based on overlapping of the set of PEPs. With the clock gates and their PEPs available, an overlap graph G(V,E) is created where the vertices V correspond to the clock gates and the edges E correspond to vertex pair (v1, v2) such that v1 and v2 have overlapping PEPs at step 1020. The eligible clock gate set can, thus, be mapped to multiple connected overlap graphs.

The problem of eliminating local IR drop hotspots to finding unique vertex colors for the extracted overlap graph is reduced at step 1025 by running vertex colors (a coloring scheme) on each of the overlap graphs to determine a mapping of preliminary test control signal to the set of clock gates. Finding a minimum set of vertex colors will also ensure that the number of independent test control ports at the block boundary is also kept to a minimum, thereby minimizing the area of any IO limited blocks. There are multiple vertex coloring algorithms in the literature that can be used such as Brelaz's greedy heuristic algorithm, commercial implementations of which are also available that can be easily used with any existing physical design flow.

Using the vertex color mapping thus identified, it is ensured that vertices with a common color are mapped to the same test enable and conversely, vertices with different colors are mapped to a different test enable. A one-hot activation of test enables now ensures that the clock gates in two different test enable groups are less likely to simultaneously switch (since they are now dependent only on the functional enable), thereby minimizing potential local IR drop hotspots.

The vertex coloring scheme described above runs independently per overlap graph and guarantees the color separation of overlapping nodes. However, the initial vertex coloring solution is agnostic of the fact that structural paths can exist between the independent overlap graphs. Therefore, the vertex coloring determined independently for two overlap graphs can create a scenario where there are a number of structural paths between flip-flops controlled by differently colored eligible clock gate elements (referred to as "color crossing"). Given the one-hot activation need from a local overlap graph perspective, the algorithm may have created a scenario for potential coverage loss or pattern inflation since downstream ATPG will now rely on the functional enable values for coverage recovery. It is also noted that a given overlap graph can be "recolored" so that overlapping nodes remain color separated within, while ensuring that "color crossings" are minimized. This is illustrated using FIGS. 11a and 11b.

Figure 11A:
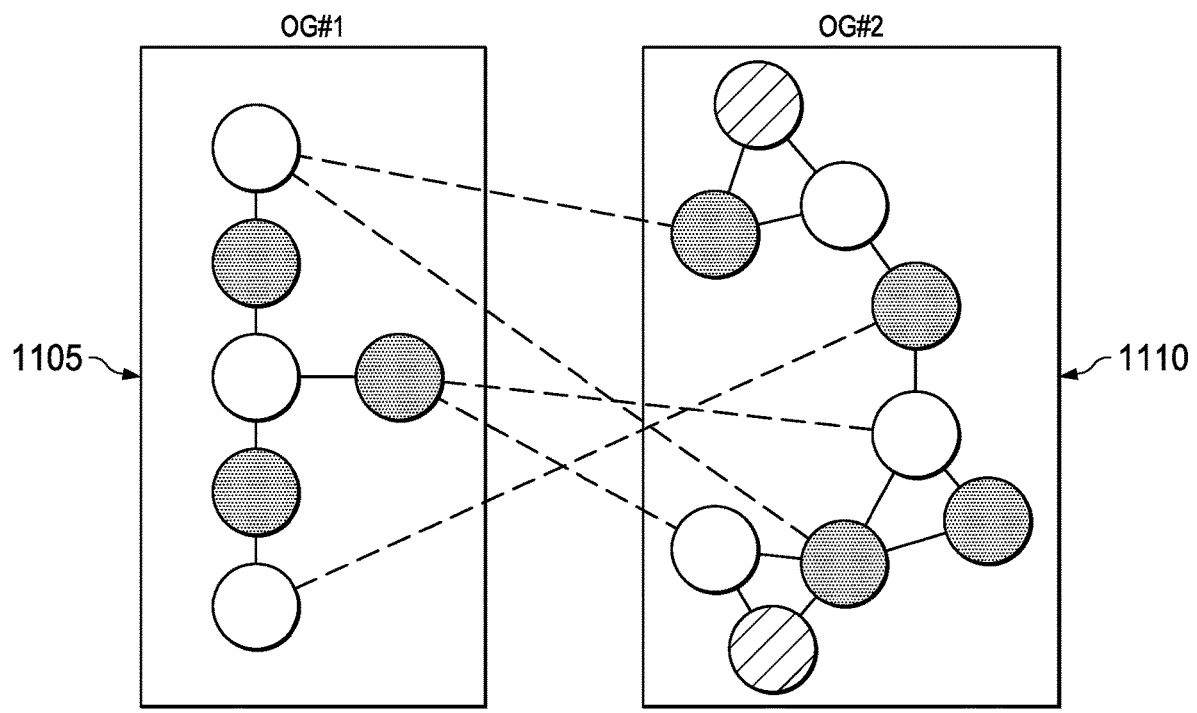
FIGS. 11a and 11b depict a coloring scheme according to an embodiment.
Figure 11B:
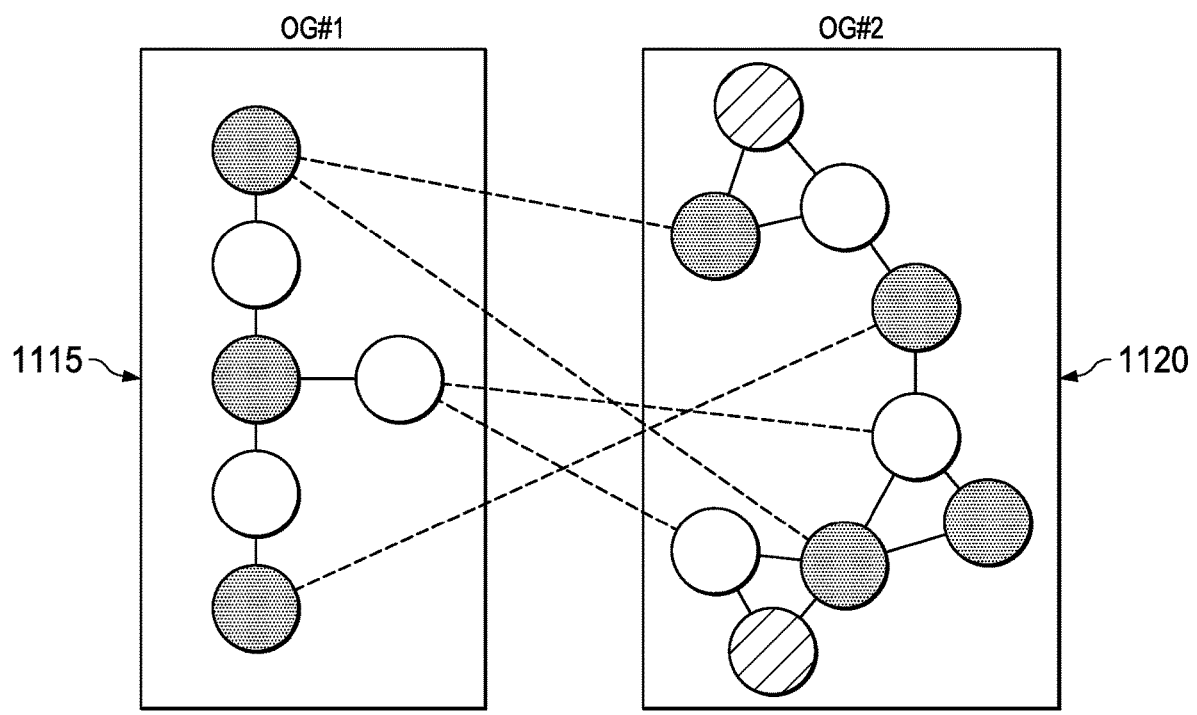

Referring now to FIG. 11a, OG1 (1105) and OG2 (1110) are two overlap graphs for a given eligible clock gate. Each graph has been individually, satisfactorily colored with a minimum number of colors. Consider now the dashed lines that represent structural paths between the connected nodes. If every dashed connection is assumed to represent 10 paths, and considering the fact that differently colored nodes cannot switch together, this coloring solution has created 50 color crossings. In FIG. 11b, the black and white nodes of OG1 (1115) is swapped. This optimization, while maintaining the coloring sanctity of the individual overlap graphs, eliminated all color crossings between OG1 (1115) and OG2 (1120).

Therefore an iterative recoloring step is proposed according to an embodiment that reduces the number of color crossings across overlap graphs by a cost-driven color swap within overlap graphs. The algorithm uses two data structures: (a) vertex-colored overlap graphs and (b) vertex connectivity matrix that is indicative of the number of paths between flip flops clocked by the clock gates.

Figure 12:
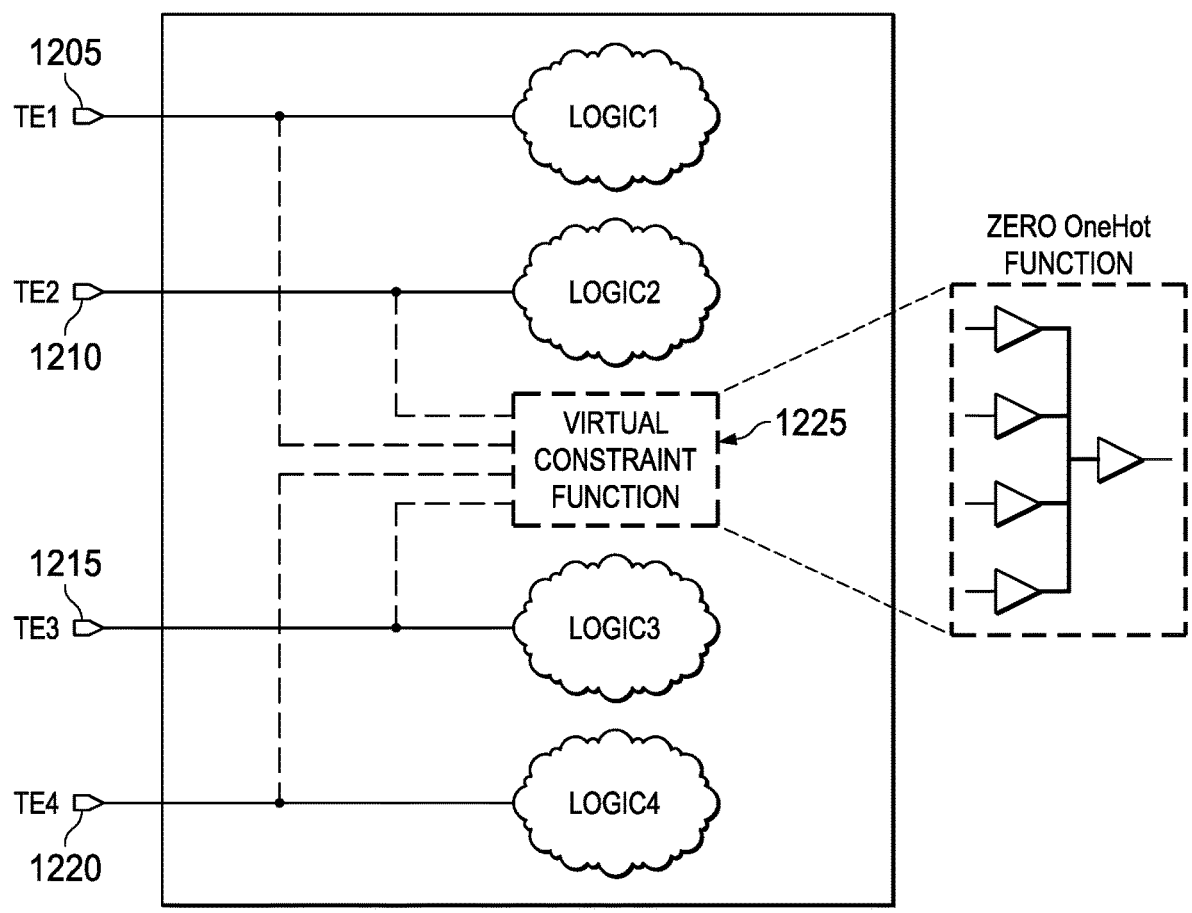
FIG. 12 depicts a virtual constraint function implementation according to an embodiment.

It is noted that with single test control, an ATPG tool gives the best result in terms of test coverage and pattern count. But, since it has no granular control on the clock gates, it is virtually impossible to meet the requirements of patterns with lower switching activity. In one embodiment, ATPG flow is customized to generate low power patterns, while ensuring that constraints related to the test mode activation of clock gates are honored. The overall ATPG flow can additionally leverage the inherent coarse-grained flip-flop switching throttling features available in commercial ATPG tools—that is, ensure that each pattern meets user specified maximum switching activity thresholds in capture cycles during TFT pattern generation. Patterns are generated using a virtual constraint function to selectively enable the set of test control signals such that the set of test control signals are not activated simultaneously. The virtual constraint function is created by receiving a set of values of the set of test control signals, then checking for a contention corresponding to the set of values where more than one of the set of values is logic 1, and by removing a pattern associated with contention dynamically during pattern generation. The virtual constraint function (VCF) encapsulates the desired property related to activation of clock gates. The test enable controls of clock gates in a circuit (ports or scan flop outputs) need to be activated in a one-hot manner. An example VCF is depicted in FIG. 12 where there are four test enable ports (1205, 1210, 1215 and 1220) shown. The VCF 1225 functions as a monitor that takes the values of the four test enable ports (1205, 1210, 1215 and 1220) as inputs and has a floating output. If more than one enable value becomes one, a contention arises in the VCF. Pattern generation can now be performed in the presence of VCF, with a directive to the ATPG tool to dynamically remove any pattern creating a contention during capture. Thus, the patterns generated will ensure that for a given capture cycle utmost only one test-enable control would be active. It is noted that the VCF can be extended to encapsulate other power constraints including those related to functional enables of clock gates. The generated patterns can be further screened to ensure that they respect any capture switching thresholds driven from functional usecase data. We have additionally made this optimization an iterative flow where violating patterns are dropped and patterns regenerated for the corresponding faults. This is because since some commercial ATPG tools do not necessarily guarantee capture switching thresholds in their pattern sets (with precedence given to test coverage over power in their internal cost functions).

Various embodiments are implemented in a system for testing the IC. The system includes a computer system having a test processor, the test processor being coupled to the integrated circuit, the integrated circuit having a set of sub-chips, a plurality of cores and a cache and an I/O port. The test controller is configured to activate a set of clock gates in the set of sub-chips in a neighborhood of the integrated circuit in selective manner during at-speed mode of operation. The test controller, in response to a stimuli from the test processor, is configured to generate a set of test control signals that activates the set of clock gates by creating a set of representations that overlays power density information and clock gate physical locations of a set of clock gates in a critical sub-chip of the integrated circuit for test mode power analysis, grouping the set of representations in the sub-chip into various groups based on overlapping of the set of representations, and by generating a set of test control signals corresponding to each of the set of clock gates during at-speed test mode of operation such that each clock gate with overlapping representations receive different test control signals.

Various embodiments provide test hooks in the form of multiple test enable controls to clock gates in a circuit to eliminate any modifications to the functional path and can hence be a simple engineering change order (ECO) even late in the design cycle. The DFT hooks can be used with any commercial ATPG flow through the addition of virtual constraints that can enable clock gates in a selective manner.

Processes and logic flows described herein may be performed by one or more programmable processors executing one or more computer programs to perform functions by operating on input data and generating corresponding output. Processes and logic flows described herein may be performed by, and apparatus can also be implemented as, special purpose logic circuitry, e.g., an FPGA device or an ASIC. The foregoing description sets forth numerous specific details to convey a thorough understanding of the invention. However, it will be apparent to one skilled in the art that the invention may be practiced without these specific details. Well-known features are sometimes not described in detail in order to avoid obscuring the invention. Other variations and embodiments are possible in light of above teachings, and it is thus intended that the scope of invention not be limited by this Detailed Description, but only by the following Claims.

What is claimed is:

1. A method comprising:
    performing an IR drop analysis for an integrated circuit (IC), the IR drop analysis including:
        performing a static IR drop analysis for the IC, the static IR drop analysis identifying a first region of the IC having a maximum average power hotspot; and
        performing a dynamic IR drop analysis for the first region, the dynamic IR drop analysis identifying a second region of the IC having an instantaneously high IR drop, the second region including clock gate circuits;
    determining, for each clock gate circuit, a respective representation indicating power density within a respective area of the second region including the clock gate circuit;
    determining, from the representations, a first area including a first clock gate circuit and a second area including a second clock gate circuit, in which the first and second areas at least partially overlap;
    determining a first test control signal for the first clock gate circuit and a second test control signal for the second clock gate circuit, the first test control signal having a timing offset from the second test control signal.

2. The method of claim 1, wherein determining the respective representations includes:
    identifying eligible clock gate circuits of the clock gate circuits;
    extracting location and load information for the eligible clock gate circuits; and
    computing the respective representations based on the location and load information.

3. The method of claim 1, wherein determining the first and second areas at least partially overlap includes:
    extracting overlap graphs from the representations; and
    running a coloring scheme on the overlap graphs to determine a mapping of preliminary test control signals for the first and second clock gate circuits.

4. The method of claim 3, wherein running the coloring scheme includes:
    creating a clock gate connectivity matrix; and
    reassigning the color scheme incrementally across the overlap graphs.

5. The method of claim 1, further comprising:
    generating patterns using a virtual constraint function to selectively enable the first and second test control signals with the timing offset.

6. The method of claim 5, wherein generating the patterns includes:
    receiving values of the first and second test control signals;
    checking for a contention corresponding to the values where more than one of the values is a logic 1; and
    removing a pattern associated with the contention.

7. A computer system comprising:
    a processor or logic circuitry configured to:
        perform an IR drop analysis for an integrated circuit (IC), the IR drop analysis including:
            performing a static IR drop analysis for the IC, the static IR drop analysis identifying a first region of the IC having a maximum average power hotspot; and
            performing a dynamic IR drop analysis for the first region, the dynamic IR drop analysis identifying a second region of the IC having an instantaneously high IR drop, the second region including clock gate circuits;
        determine, for each clock gate circuit, a respective representation indicating power density within a respective area of the second region including the clock gate circuit;
        determine, from the representations, a first area including a first clock gate circuit and a second area including a second clock gate circuit, in which the first and second areas at least partially overlap;
        determine a first test control signal for the first clock gate circuit and a second test control signal for the second clock gate circuit, the first test control signal having a timing offset from the second test control signal.

8. The computer system of claim 7, wherein the processor or logic circuitry configured to determine the respective representations includes:
    identifying eligible clock gate circuits of the clock gate circuits;
    extracting location and load information for the eligible clock gate circuits; and
    computing the respective representations based on the location and load information.

9. The computer system of claim 7, wherein the processor or logic circuitry configured to determine the first and second areas at least partially overlap includes:
    extracting overlap graphs from the representations; and
    running a coloring scheme on the overlap graphs to determine a mapping of preliminary test control signals for the first and second clock gate circuits.

10. The computer system of claim 9, wherein running the coloring scheme includes:
    creating a clock gate connectivity matrix; and
    reassigning the color scheme incrementally across the overlap graphs.

11. The computer system of claim 7, wherein the processor or logic circuitry is further configured to:

generate patterns using a virtual constraint function to selectively enable the first and second test control signals with the timing offset.

12. The computer system of claim 11, wherein generating the patterns includes:
receiving values of the first and second test control signals;
checking for a contention corresponding to the values where more than one of the values is a logic 1; and
removing a pattern associated with the contention.

13. A test system comprising:
an integrated circuit (IC); and
a computer system including a processor or logic circuitry, the processor or logic circuitry configured to:
perform an IR drop analysis for the IC, the IR drop analysis including:
performing a static IR drop analysis for the IC, the static IR drop analysis identifying a first region of the IC having a maximum average power hotspot; and
performing a dynamic IR drop analysis for the first region, the dynamic IR drop analysis identifying a second region of the IC having an instantaneously high IR drop, the second region including clock gate circuits;
determine, for each clock gate circuit, a respective representation indicating power density within a respective area of the second region including the clock gate circuit;
determine, from the representations, a first area including a first clock gate circuit and a second area including a second clock gate circuit, in which the first and second areas at least partially overlap;
determine a first test control signal for the first clock gate circuit and a second test control signal for the second clock gate circuit, the first test control signal having a timing offset from the second test control signal.

14. The test system of claim 13, wherein the processor or logic circuitry configured to determine the respective representations includes:
identifying eligible clock gate circuits of the clock gate circuits;
extracting location and load information for the eligible clock gate circuits; and
computing the respective representations based on the location and load information.

15. The test system of claim 13, wherein the processor or logic circuitry configured to determine the first and second areas at least partially overlap includes:
extracting overlap graphs from the representations; and
running a coloring scheme on the overlap graphs to determine a mapping of preliminary test control signals for the first and second clock gate circuits.

16. The test system of claim 15, wherein running the coloring scheme includes:
creating a clock gate connectivity matrix; and
reassigning the color scheme incrementally across the overlap graphs.

17. The test system of claim 13, wherein the processor or logic circuitry is further configured to:
generate patterns using a virtual constraint function to selectively enable the first and second test control signals with the timing offset.

18. The test system of claim 17, wherein generating the patterns includes:
receiving values of the first and second test control signals;
checking for a contention corresponding to the values where more than one of the values is a logic 1; and
removing a pattern associated with the contention.

* * * * *